United States Patent [19]

Regnier

[11] 4,308,470
[45] Dec. 29, 1981

[54] DIGITAL-TO-ANALOG SWITCHING INTERFACE CIRCUIT

[75] Inventor: Gerard S. Regnier, Fremont, Calif.

[73] Assignee: Fairchild Camera and Instrument Corp., Mt. View, Calif.

[21] Appl. No.: 133,691

[22] Filed: Mar. 25, 1980

[51] Int. Cl.³ .......................... H03K 3/29; G08C 9/00
[52] U.S. Cl. .................................. 307/475; 307/292; 307/443
[58] Field of Search ................. 307/DIG. 1, 475, 292, 307/443, 300, 315

[56] References Cited

U.S. PATENT DOCUMENTS

| | | | |
|---|---|---|---|
| 3,610,962 | 10/1971 | Meyer | 307/475 |
| 3,641,362 | 2/1972 | Gamble | 307/443 |
| 3,959,665 | 5/1976 | Gilbreath et al. | 307/475 |

*Primary Examiner*—Harold A. Dixon
*Attorney, Agent, or Firm*—Paul J. Winters; Theodore S. Park; Warren M. Becker

[57] ABSTRACT

A transistor interface circuit for switching analog differential pairs in response to a flip-flop or combinational logic, both output signals of which remain either high or low during switching transitions. This circuitry prevents the differential pair from momentarily saturating or shutting off during the switching transition.

1 Claim, 2 Drawing Figures

DIGITAL-TO-ANALOG SWITCHING INTERFACE CIRCUIT

BRIEF SUMMARY OF THE INVENTION

This invention relates to switching transistor circuitry and particularly to a novel interface circuitry for switching differential pairs of multipliers in response to signals from flip-flops or combinational logic.

In some flip-flops or combinational logic circuits, both of the output signals may remain either high or low during the switching transition. If such circuitry is used to drive analog differential pairs of multipliers, each transistor in the pair may thus momentarily conduct or shut off during the switching transition to produce serious analog output signal disturbances.

The interface circuitry of the invention produces a smooth output wave form at the analog output during such switching transitions so that the subsequent analog circuitry to which it is coupled may be switched without output spikes of other transient disturbances. Briefly described, the interface circuitry of the invention receives from digital gating circuitry a pair of input signals, both of which, during switching transistions, may be at high or low states. The circuitry then translates these input signals into output signals which, when applied to subsequent differential pairs or multiplier circuitry, enables this analog circuitry to produce an undisturbed switching transition without disruptive switching transients.

BRIEF DESCRIPTION OF THE DRAWINGS

In the drawings which illustrate a preferred embodiment of the invention.

DETAILED DESCRIPTION

Figure 1:
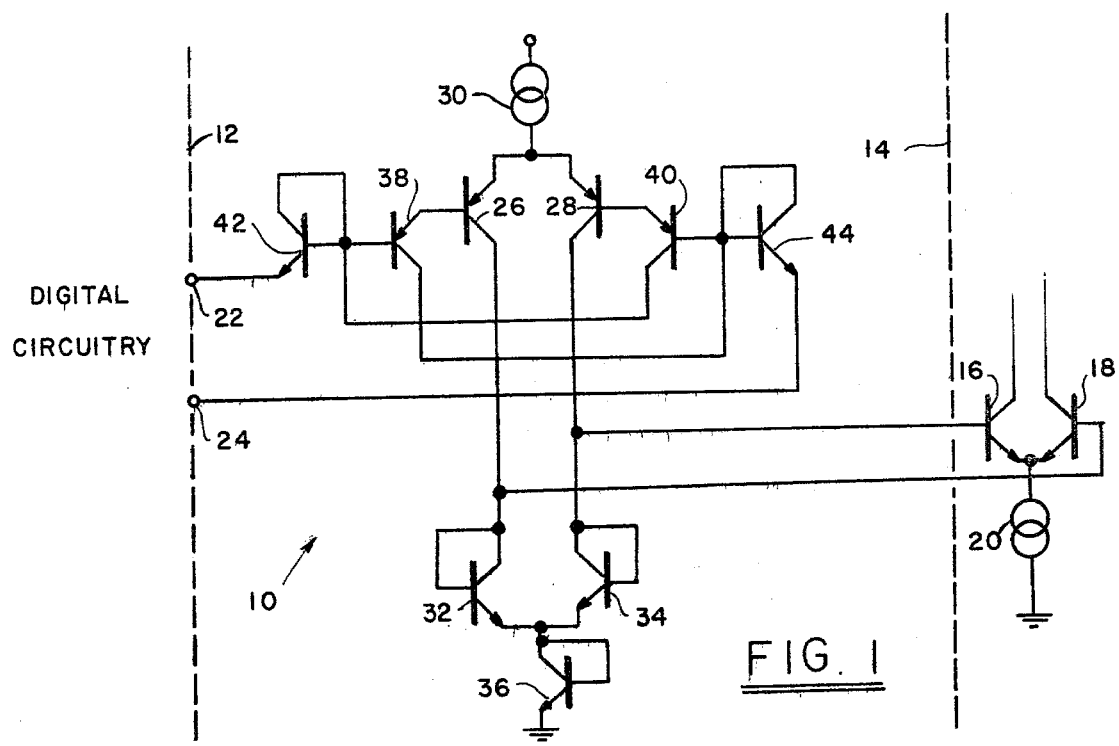
FIG. 1 is a schematic diagram of the interface circuitry of the invention.

Illustrated in the schematic diagram of FIG. 1 is the interface circuit 10 interposed between a digital switching circuit 12 and an analog circuit 14 which may include a differential pair comprising transistors 16 and 18, the interconnected emitters of which are coupled to ground reference through a current source 20.

The digital circuitry 12 may include various gating circuits, for example, current injection logic circuits, that provide output signals at the terminals 22 and 24 and which, during a switching transition are momentarily at the same state. That is, during the brief switching transition, the signals at terminals 22 and 24 may both be at a low state. If these signals were applied directly to the analog circuit 14, the transistors 16 and 18 would be momentarily rendered non-conductive or if their bases were allowed to rise to a momentary high level, a noticeable disturbance would occur in their output signals.

The interface circuitry 10 of FIG. 1 provides a smooth transient free switching signal between the digital circuitry 12 and the analog circuitry 14 and includes PNP transistors 26 and 28, the emitters of which are connected together and through a current source 30 to a source of positive voltage. The collector of transistor 26 is coupled to the anode or collector of a diode connected transistor 32 and the collector of transistor 28 is similarly connected to the anode of a diode connected transistor 34. The emitters, or cathodes of the diodes 32 and 34 are connected together and to the collector of a diode connected transistor 36, the emitter of which is at lower reference voltage or ground.

The collector of transistors 26 and 28 also provide the output signals of the interface circuit 10 and, as illustrated in FIG. 1, are coupled respectively to the bases of transistors 18 and 16 in the analog circuitry 14.

The base elements of transistors 26 and 28 are respectively coupled to the emitters of PNP transistors 38 and 40. The collector of transistor 38 is coupled to the base of transistor 40, and the collector of transistor 40 is coupled to the base of transistor 38. The base of transistor 38 is also coupled to the anode of a diode connected NPN transistor 42, and the base of transistor 40 is connected to the base, or anode of the diode connected NPN transistor 44. The emitter, or cathode of the diode of transistor 42 is connected to the digital circuitry of the terminal 22 and the emitter, or cathode of the diode connected transistor 44 is connected to the output terminal 24 of the digital circuitry 12.

OPERATION OF THE CIRCUITRY

Figure 2:
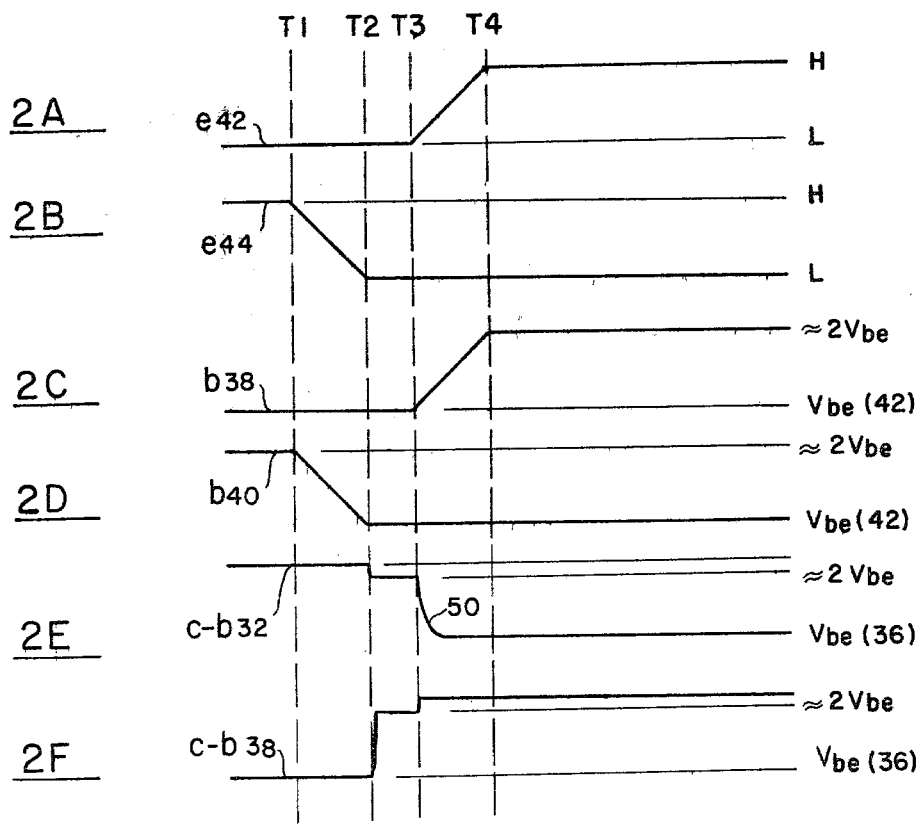
FIG. 2 is a waveform diagram illustrating the voltage levels of various circuit components before, during, and after the switching transition.

The operation of the circuitry may be better understood by reference to the waveform diagram of FIG. 2 wherein the vertical dashed line labeled T1 represents time just prior to the switching operation, the time between the lines labeled T2 and T3 represent the momentary time during which both input signals appearing at terminals 22 and 24 are in the same low state, and the line designated T4 represents time at the end of the switching period.

Assuming the condition existing at time T1, the signal at digital output terminal 22, and thus the signal on the emitter of transistor 42 (FIG. 2A) is low because the digital gate providing the signal at terminal 22 is conducting current, while the signal at 24 and thus at emitter 44 is high (FIG. 2B). The current through transistor 42 drops the base voltage at 38 and provides its base current. Transistor 38 conducts, removing residual charge from the base of transistor 40. This residual charge is combined with the base current of transistor 38 to form an initial surge of base current to transistor 26 causing it to turn on and forces transistor 28 off. Current out of the collector of transistor 26 is now doubled and flows through diode connected transistor 32. The voltage at 32 increases by approximately 18 mu (T3) and is applied to the analog circuit 14 to cause conduction of transistor 18 in the differential pair.

At the time of switching, times T2-T3, both signals at the output terminals 22 and 24 of the digital circuitry 12 are low. Therefore, the voltage applied to the bases of transistors 38 and 40 (FIGS. 2C and 2D) becomes the saturation voltage of the gates providing the output to terminals 22 and 24 plus the base to emitter voltage ($V_{be}$) of transistors 42 and 44. Since transistors 38 and 40 have the same base currents, their collector currents are approximately equal and they, in turn, drive the bases of transistors 26 and 28. These transistors 26 and 28 now conduct equally so that there is the same voltage drop across the diode coupled transistors 32 and 34. The bases of the analog differential pair transistors 16 and 18 are held at a comfortable level of $2V_{be}$ above ground and conduct equally.

When switched, the digital output appearing at terminal 22 will go to a high level because of current shutoff in the gate providing the output to terminal 22, whereas the gate providing the output to terminal 24 remains saturated. Since no current can pass through terminal 22, the base to emitter voltage of the diode connected transistor 42 collapses to turn off the base current of transistor 38. Since there still is current conduction through output terminal 24 through the diode connected transistor 44, there is base current for transistor 40. Any residual charge remaining on the base of transistor 38 is drained by transistor 40 and combines as base current for transistor 28 to turn on the transistor 28.

Transistor 28 is now on and transistor 26 is off, allowing the diode connected transistor 32 to collapse at a relatively slow rate as indicated by the curve 50 in the waveform of FIG. 2E. Now all currents flow through the right side of the circuitry of FIG. 1. The current through the diode connected transistor 24 is effectively doubled and the diode drop across this diode jumps up approximately 18 millivolts. Simultaneously the voltage across diode connected transistor 32 collapses to pull the base of the analog circuit transistor 18 to a low level while the base of the transistor 16 in the differential pair jumps by approximately 18 millivolts. Thus, a clean switching waveform without transient spikes is provided.

Having thus described my invention, what is claimed is:

1. A digital-to-analog switching interface circuit for producing transient-free output signals in response to a pair of binary input switching signals having the same output states during the switching transition, said interface circuit comprising:

first and second PNP transistors having intercoupled emitters coupled to a positive current source, the collectors of said first and second transistors being respectively coupled to the anodes of first and second diodes, the cathodes of which are coupled together and through a third diode to negative reference;

first and second signal output terminals coupled respectively to the collectors of said first and second PNP transistors; and third and fourth PNP transistors, the emitters of which are coupled respectively to the base elements of said first and second PNP transistors, the base of said third transistor being coupled to the collector of said fourth transistor, the base of said fourth transistor being coupled to the collector of said third transistor, the bases of said third and fourth transistors being coupled respectively through fourth and fifth diodes to first and second input terminals of said interface circuitry.

* * * * *